United States Patent [19]

Arai

[11] Patent Number: 5,744,373

[45] Date of Patent: Apr. 28, 1998

[54] METHOD OF MANUFACTURING A SEMICONDUCTOR DEVICE

[75] Inventor: Katsujiro Arai, Osaka, Japan

[73] Assignee: Matsushita Electronics Corporation, Osaka, Japan

[21] Appl. No.: 310,001

[22] Filed: Sep. 20, 1994

Related U.S. Application Data

[62] Division of Ser. No. 213,362, Mar. 15, 1994, Pat. No. 5,374,840, which is a continuation of Ser. No. 2,511, Jan. 8, 1993, abandoned, which is a continuation of Ser. No. 623,651, Dec. 21, 1990, abandoned.

[30] Foreign Application Priority Data

Apr. 25, 1898 [JP] Japan ..................... 1-104957

[51] Int. Cl.⁶ ..................... H01L 21/265; H01L 21/70; H01L 27/00
[52] U.S. Cl. ..................... 437/59; 437/43; 437/52; 437/57; 437/979
[58] Field of Search ..................... 437/141, 145, 437/148, 153, 57, 59, 43, 54, 74, 75, 76, 52, 56, 979

[56] References Cited

U.S. PATENT DOCUMENTS

| | | | |
|---|---|---|---|
| 3,959,040 | 5/1976 | Robertson | 437/59 |
| 3,977,920 | 8/1976 | Imaizumi et al. | 437/148 |
| 4,130,826 | 12/1978 | Bachle. | |
| 4,476,480 | 10/1984 | Fuse. | |
| 4,734,382 | 3/1988 | Krishna | 437/57 |
| 4,859,619 | 8/1989 | Wu et al. | |
| 4,887,142 | 12/1989 | Bertotti. | |
| 5,108,944 | 4/1992 | Shirai et al. | 437/57 |
| 5,156,984 | 10/1992 | Ahn | 437/59 |
| 5,183,773 | 2/1993 | Miyata | 437/52 |

FOREIGN PATENT DOCUMENTS

| | | |
|---|---|---|
| 0 319 047 | 6/1989 | European Pat. Off.. |
| 60-223157 | 11/1985 | Japan. |
| 61-287165 | 12/1986 | Japan. |
| 62-276868 | 12/1987 | Japan. |

*Primary Examiner*—Brian Dutton
*Attorney, Agent, or Firm*—Lowe, Price, LeBlanc & Becker

[57] ABSTRACT

An epitaxial layer is formed on a semiconductor substrate, and a CMOS circuit or a functional device is formed on an impurity layer deeply extended to reach the semiconductor substrate and on an epitaxial layer region surrounded by the impurity layer. Thus the devices are substantially equivalent to those formed on a silicon substrate having no epitaxial layer. A CMOS circuit or functional device formed on an impurity layer that does not reach the semiconductor substrate and on the epitaxial layer region is made electrically independent of the semiconductor substrate, and hence can be deemed to be substantially equivalent to the case when the epitaxial layer is made to serve as a substrate.

An epitaxial layer of a conductivity type reverse to that of a silicon substrate is used, and hence a plurality of functional devices can be formed respectively thereon at the same time. It is also possible to prevent occurrence of defective writing in the EPROM thus formed and also prevent the deterioration of an analog circuit that may be caused by the back bias.

3 Claims, 12 Drawing Sheets

METHOD OF MANUFACTURING A SEMICONDUCTOR DEVICE

This application is a divisional of application Ser. No. 08/213,362 filed Mar. 15, 1994, now U.S. Pat. No. 5,374,840 which is a continuation of application Ser. No. 08/002,511, filed Jan. 8, 1993, now abandoned which is a continuation of application Ser. No. 07/623,651 filed Dec. 21, 1990 now abandoned.

TECHNICAL FIELD

This invention relates to a semiconductor device and a process for manufacturing it.

BACKGROUND ART

In recent years, in order to achieve a higher function of MOSLSIs, a method has been developed in which presently available functional devices are formed on one chip. In order to achieve a higher function of a one-chip microcomputer (hereinafter referred to as an microcomputer), a nonvolatile memory device such as EPROM (ultraviolet-erasable programmable ROM) is formed on one chip together with the microcomputer.

The EPROM is formed of an n-channel MOS transistor provided on a p-type silicon substrate. On the other hand, the microcomputer is comprised of a complementary MOS (hereinafter referred to as CMOS) provided on an n-type silicon substrate. Hence it is necessary to appropriately change microcomputer circuits and manufacturing processes so that the EPROM can be mounted on the microcomputer.

FIG. 1 cross-sectionally illustrates a device in which an EPROM comprised of a CMOS and a microcomputer comprised of a CMOS, provided on a p-type silicon substrate, are formed on one chip.

A p-type impurity layer 2 and n-type impurity layers 3 and 4 provided adjacently to the p-type impurity layer 2 are formed on a p-type silicon substrate 1. An n-channel transistor 5 that constitutes a CMOS circuit is formed on the p-type impurity layer 2. P-channel transistors 6 and 7 are formed on the n-type impurity layers 3 and 4, respectively. An EPROM 8 is directly formed on the p-type silicon substrate so that a high-speed performance can be improved.

Two kinds of voltages are applied to the EPROM, which are an electric source voltage (5V) and a writing voltage (12.5 V). A drive circuit that applies a voltage of 5 V to the EPROM is formed in the p-channel transistor 6, and a drive circuit that applies a voltage of 12.5 V to the EPROM is formed in the p-channel transistor 7.

Here, the p-type impurity layer 2 is formed between the n-type impurity layers 3 and 4. Hence the n-type impurity layers 3 and 4 having different voltage values are electrically separated from each other. The p-type silicon substrate 1, the p-type impurity layer 2 and the source of the n-channel transistor 5 electrically communicate and hence each have ground potential. In this way, the source of the n-channel transistor 5 and the p-type impurity layer 2 are all made to have ground potential when a microcomputer on which an EPROM is mounted is formed on the p-type silicon substrate 1.

As described above, in microcomputers having no special functional circuit in the body of a microcomputer, the EPROM can be mounted without difficulty by making an alteration in the silicon substrate.

To more detail the construction of the device shown in FIG. 1, FIG. 2 illustrates a perspective view of the device.

In FIG. 2, the p-type impurity layer 2 fitted thereon with the n-channel transistor 5 is formed within the region surrounded by a p-type impurity layer 20. The n-type impurity layers 3 and 4 fitted thereon with the p-channel transistors 6 and 7, respectively, are also formed, and the EPROM 8 is formed on the surface of the p-type silicon substrate 1. Here, the p-type impurity layer 2 that electrically separates the n-type impurity layers 3 and 4 is present between the p-channel transistor 6 that supplies the voltage of 5 V for driving the EPROM 8 and the p-channel transistor 7 that supplies the voltage of 12.5 V for writing.

In such a conventional device, the potential of the p-type impurity layer 2 must be independently controlled in the CMOS circuit. No analog circuit can be driven unless the potential of the p-type impurity layer 2 can be independently controlled. Hence, in order to use the p-type impurity layer 2 in an independently controlled state, the CMOS circuit must be formed on an n-type silicon substrate 1. This means that the p-channel transistors 6 and 7 formed on the n-type impurity layers 3 and 4, respectively, come to have potential common to that of the silicon substrate in the case when the CMOS is formed on the n-type silicon substrate 1. On the other hand, in respect of the n-channel transistor 5 formed on the p-type impurity layer 2, the voltage can be independently applied regardless of the n-type silicon substrate 1.

However, in the case when an MOS analog circuit is formed on the body of a microcomputer, an alteration of the silicon substrate makes it necessary to design the analog circuit once more, bringing about a lowering of function on account of the alteration of a circuit design.

FIG. 3 cross-sectionally illustrates a device in which an operational amplifier that constitutes an A/D (analog-to-digital) converter of an MOS analog circuit is mounted on the body of a microcomputer.

P-type impurity layers 11 and 12 are formed on an n-type silicon substrate 10. An n-type impurity layer 13 is also formed adjoiningly to the p-type impurity layers 11 and 12. An n-channel transistor 14 for the part of an operational amplifier is formed on the p-type impurity layer 11. Other n-channel transistor 15 and p-channel transistor 16 are formed on the p-type impurity layer 12 and the n-type impurity layer 13, respectively.

At the n-channel transistor 14, an n-type high-density impurity layer 17 serving as a source is in contact with a p-type high-density impurity layer 18. Hence the source potential at the source of the n-channel transistor 14 is designed to be in agreement with the potential of the p-type impurity layer 11. Thus, the device can operate in the manner that the back bias effect can be prevented even when the potential at the source is varied.

If a p-type silicon substrate is used to form a microcomputer having such a functional circuit, on one chip together with an EPROM, the p-type impurity layers are all fixed to the ground potential of the silicon substrate since the n-channel transistor has a source that can have the same potential as that of the p-type silicon substrate. As a result, the n-channel transistor does not operate. The MOS analog circuit, designed making the most of the characteristic features of the p-type impurity layer formed on the n-type silicon substrate, does not function at all when the p-type silicon substrate is used.

In order to solve such problems, in usual instances the source of the n-channel transistor and the p-type silicon substrate are electrically disconnected and the circuit is operated in the state the back bias effect has been brought about. In the state the back bias effect has been brought about, however, the analog circuit may undergo serious deterioration of its characteristics.

In order that a circuit comprising a microcomputer and, formed on the body thereof, a functional device such as an MOS analog circuit can be formed on one chip together with a nonvolatile memory device, an n-type high-density impurity layer and a p-type high-density impurity layer are formed in contact with the source of an n-channel transistor of the analog circuit using an n-type silicon substrate, where the source voltage is made to be in agreement with the potential of the p-type impurity layer so that the back bias effect may not be caused.

When, however, an EPROM is formed on the n-type silicon substrate, the EPROM is formed on the p-type impurity layer. In order to drive the EPROM, the p-channel transistor supplies 5 V of drive voltage and 12.5 V of writing voltage. Here, the substrate current generated at the time of Writing is accumulated in the p-type impurity layer to cause defective writing. Thus, the EPROM can operate without difficulty when a p-type silicon substrate is used in such a way that the substrate current may not be accumulated in the p-type impurity layer.

On the other hand, the analog circuit does not operate at all since the p-type impurity layer and the source are made to have the same potential. For this reason, when the source and the p-type silicon substrate are used in an electrically separated state, there is a problem that the back bias effect is caused to bring about a deterioration of the characteristics of the analog circuit.

An object of the present invention is to provide a semiconductor device comprising a nonvolatile memory device and a functional device, formed on the same chip, that may cause no defective writing of the EPROM and also may cause no deterioration of the analog circuit, and a process for manufacturing such a device.

DISCLOSURE OF THE INVENTION

The present invention aims at providing a semiconductor device that can solve the above problems, and a process for manufacturing the same. The device is comprised of a semiconductor substrate of one conductivity type; an epitaxial layer of a conductivity type reverse to said semiconductor substrate, formed on said semiconductor substrate; a first impurity layer formed in said epitaxial layer in such a way that it reaches said semiconductor substrate; a second impurity layer of a conductivity type reverse to that of said first impurity layer, surrounded by said first impurity layer; and a third impurity layer formed separately from said first impurity layer. The process is provided with the step of forming on a semiconductor substrate of one conductivity type an epitaxial layer of a conductivity type reverse to that of said semiconductor substrate, the step of forming an insulating film on said epitaxial layer, the step of bringing said insulating film at a given region into a film having a second thickness, and the step of forming in said epitaxial layer at the part of said given region a first impurity layer of the same conductivity type as said semiconductor substrate in such a depth that it reaches said semiconductor substrate, where at least a second impurity layer of conductivity type reverse to that of said first impurity layer is present.

On account of the above constitution, the CMOS circuit or functional device formed on the impurity layer deeply extended to reach a silicon substrate and on the epitaxial layer region surrounded by such an impurity layer becomes substantially equivalent to those formed on a silicon substrate having no epitaxial layer.

Besides, the CMOS circuit or functional device formed on the impurity layer that does not reach the silicon substrate and on the epitaxial layer region is made electrically independent of the silicon substrate, and hence becomes substantially equivalent to the case when the epitaxial layer is made to serve as a substrate.

Since, as described above, the epitaxial layer of a conductivity type reverse to that of the silicon substrate is used, a plurality of functional devices can be formed respectively thereon at the same time.

It is also possible to prevent occurrence of defective writing in the EPROM thus formed and also prevent the deterioration of an analog circuit that may be caused by the back bias.

BEST MODE FOR WORKING THE INVENTION

Figure 1:
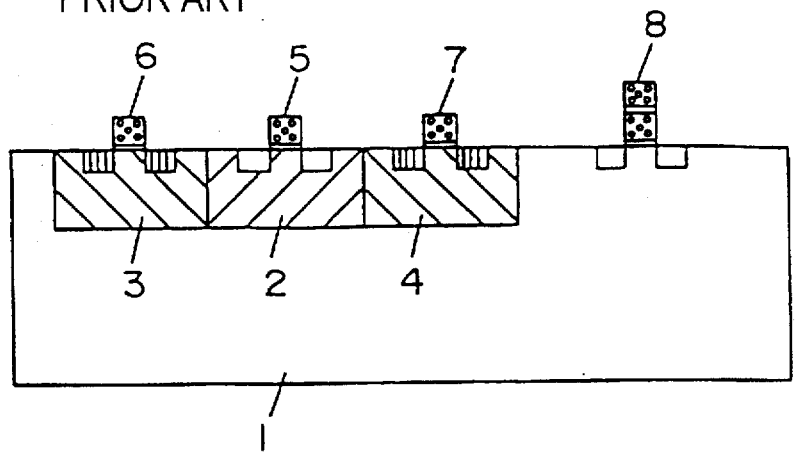
FIG. 1 is a cross-sectional view of a device, to illustrate the prior art.
Figure 2:
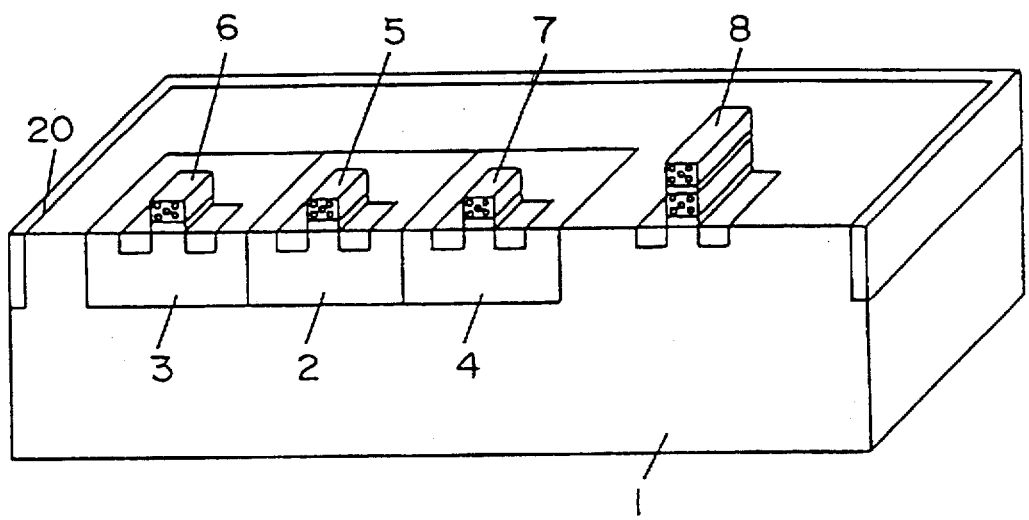
FIG. 2 is a perspective view of the device, to illustrate the prior art.
Figure 3:
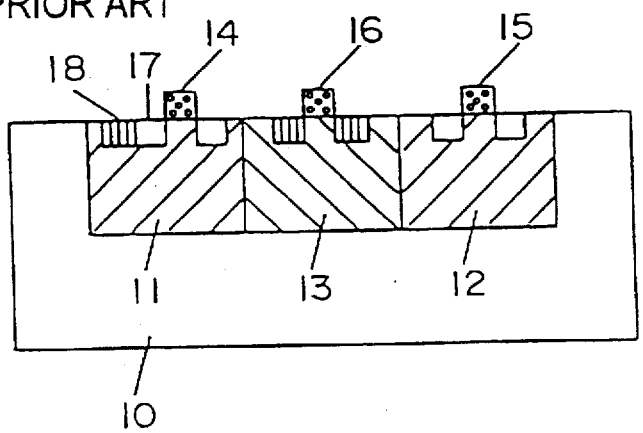
FIG. 3 is a cross-sectional view of a device, to illustrate the prior art.
Figure 4:
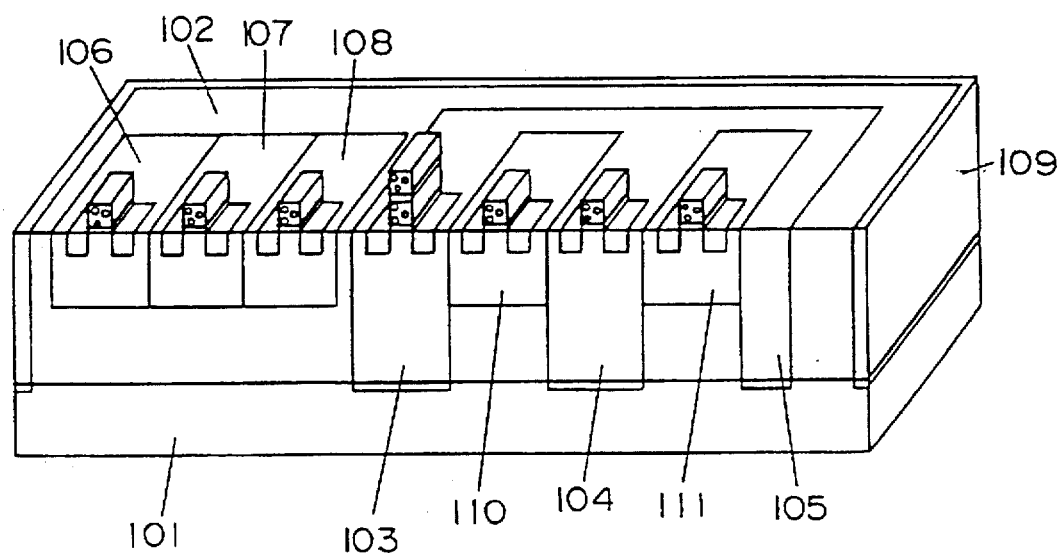
FIG. 4 is a perspective view of a device, used to describe a first embodiment of the present invention.

FIG. 4 shows a perspective view of a device, used to describe in detail a first embodiment of the present invention.

As shown in FIG. 4, an n-type epitaxial layer 102 is formed on a p-type (100) silicon substrate 101 used as a semiconductor substrate. The silicon substrate 101 used here contains boron impurities in a density of about $2 \times 10^{15}/cm^2$. The epitaxial layer 102 used has a film thickness of about 8 μm and contains phosphorus impurities in a density of $2 \times 10^{15}/cm^2$.

Next, deeply extending p-type impurity layers 103, 104 and 105 formed by selectively implanting boron ions are formed in the epitaxial layer 102. These p-type impurity layers 103, 104 and 105 extend to the depth equal to the thickness of the epitaxial layer 102 or to a depth beyond the depth to which the epitaxial layer 102 extends. Hence, the p-type impurity layers 103, 104 and 105 communicate with the silicon substrate 101 and are set to have the same potential as the potential of the silicon substrate 101. A CMOS (complementary MOS) logic circuit containing an ultraviolet-erasable programmable ROM device (hereinafter referred to as EPROM) circuit is formed on the impurity layers 103, 104 and 105 and the impurity regions between them.

At the same time when the CMOS logic circuit containing the EPROM is formed in the p-type impurity layers 103, 104 and 105, transistors that form an analog circuit are also formed on the epitaxial layer 102. Besides, a deeply extending p-type impurity layer 109 is formed in such a way that it surrounds the outer boundary of the region in which the CMOS logic circuit and the analog circuit are formed.

This p-type impurity layer 109 is formed to such a depth that it reaches the silicon substrate 101 like the p-type impurity layers 103, 104 and 105.

A relatively high voltage (about 12.5 V) is applied to the EPROM when data are written. In such a state of writing, a large quantity of substrate current is generated in the p-type impurity layer 103. Once the substrate current is generated, a potential gradient is produced in the p-type impurity layer 103. A great potential difference of this potential gradient results in a low probability of the generation of hot carriers used for the writing. The lowering of the probability of the generation of hot carriers brings about an insufficient state for the writing in the EPROM. Hence, it is necessary to flow the substrate current to the ground through the silicon substrate 101.

In the case when an EPROM is formed on a p-type impurity layer, defective writing may be caused unless the substrate current is flowed away from the substrate. Accordingly, the EPROM should be formed on the p-type silicon substrate.

Besides, n-type impurity layers 110 and 111 are reactively formed between the deeply extending p-type impurity layer 103 and p-type impurity layer 104 and between the deeply extending p-type impurity layer 104 and p-type impurity layer 105. An n-type impurity layer 107 corresponding to the region in which a p-channel transistor of the analog circuit is formed is further formed by implantation of phosphorus ions.

On the n-type impurity layers 107 and 111, p-channel transistors that generate voltages of about 5 V are formed for the purpose of driving the EPROM or operating the analog circuit. In the transistors formed on such n-type impurity layers 107 and 111, the voltages generated are so low that no substrate current may be produced. The depth to which the n-type impurity layers 107 and 111 extend is designed in such a way that they do not reach the silicon substrate 101. This is because, if the n-type impurity layers 107 and 111 come into contact with the p-type silicon substrate 101, a depletion layer is produced at the contact surface therebetween and hence the silicon substrate 101 can be separated from the n-type impurity layers 107 and 111, but on the other hand here is brought about a lowering of separation withstand voltage because of a lower absolute value of the p-type density of the silicon substrate 101 than the absolute value of the n-type density of the epitaxial layer 102. Although in this embodiment the n-type impurity layers 107 and 111 are formed in the epitaxial layer 102, these n-type impurity layers 107 and 111 are not necessarily formed if in practice, as will be described with reference to another embodiment given later, the n-type density is controlled to be approximately the same as that of the n-type impurity layers 107 and 111.

Interposing the n-type impurity layer 107, p-type impurity layers 106 and 108 are formed on both sides of layer 107 by implantation of boron ions. The p-type impurity layers 106 and 108 constitute the analog circuit together with the n-type impurity layer 107. In this embodiment, the deeply extending p-type impurity layer 103 and the p-type impurity layer 108 having formed the analog circuit are not in contact with each other and are formed in such a fashion that the epitaxial layer 102 is held between both the impurity layers. Both of these impurity layers, however, may be in contact.

If, however, the p-type impurity layers 103 and 108 are in contact, no analog circuit can be formed on the p-type impurity layer 108 for the following reasons. That is to say, if both p-type impurity layers 103 and 108 come into contact, the p-type impurity layer 108 comes to have the same potential as that of the p-type impurity layer 103 and that of the p-type silicon substrate 101. Hence the analog circuit formed on the p-type impurity layer 108 is made to have a substrate voltage since all the p-type impurity layers 103, 104, 105 and 108 present within the silicon substrate 101 are grounded. Thus, it becomes impossible to control the voltage of the analog circuit, resulting in no normal operation of the circuit.

When the impurity layers 103, 104 and 105 are used in the state they communicate with the silicon substrate 101, the transistors, which supply the voltage for the EPROM circuit formed on the n-type impurity layers 110 and 111 formed between the respective impurity layers 103, 104 and 105, can be used in the state they have independently different voltages. Namely, the EPROM requires an electric source of 5 V as an operating voltage and an electric source of 12.5 V for a writing voltage for designating its address. At the time the data for the EPROM are written, a relatively high voltage (about 12.5 V) is applied and thus the state of writing is brought about. In such a state of writing, a large quantity of substrate current is generated in the silicon substrate 101. Since the p-type impurity layers 103, 104 and 105 communicate with the silicon substrate 101, the substrate current, even if generated, the device characteristics can not be deteriorated because of the flow of the substrate current to the ground through the silicon substrate 101.

The circuit formed on the impurity layers 103, 104 and 105 deeply extended to reach the silicon substrate 101 is electrically connected with the silicon substrate 101. It therefore becomes substantially equivalent to the case when formed on a p-type silicon substrate 101 having no epitaxial layer 102.

The circuit formed on the impurity layers 106, 107, 108, 110 and 111, which do not reach the silicon substrate 101, and on the epitaxial layer 102 is made electrically independent of the silicon substrate 101, so that it becomes substantially equivalent to the case when formed on an epitaxial layer 102 made to serve as a substrate.

Among the impurity layers 103, 104, 105, 106, 107, 108, 110 and 111, the p-type impurity layers 104, 106 and 108 are fitted thereon with n-channel transistors each having two diffusion layers in which the drain and the source are of n-types and also having a gate oxide films and a gate electrode in pair.

The n-type impurity layers 107, 110 and 111 are also fitted thereon with p-channel transistors each having two diffusion layers in which the drain and the source are of p-types and also having a gate oxide film and a gate electrode in pair.

The deeply extending p-type impurity layer 103 is also fitted thereon with an n-channel EPROM having two high-density diffusion layers in which the drain and the source are of n-types and also having a gate oxide film and a gate electrode in pair, an electrode (floating) for affecting charge accumulation so that the circuit can be operated as an EPROM, and an insulating layer.

In conventional CMOS analog circuits, stable analog characteristics are obtained by controlling each potential of the transistors formed on p-type impurity layers. It is therefore necessary to use n-type silicon substrates in order to form analog circuits. Namely, if a CMOS circuit is formed on the n-type silicon substrate, the transistors formed in n-type impurity layer regions come to have the potential common to that of the silicon substrate. On the other hand, the transistors formed in p-type impurity layer regions make the respective p-type impurity layers electrically separate when they are operated. Hence the p-type impurity layer regions formed on the n-type silicon substrate can be electrically separated and the analog circuit can be used independently of the potential of the p-type impurity layer regions.

If the p-type silicon substrate 101 is used to form the EPROM, all the p-type impurity layers 103, 104 and 105 come to have ground potential. Hence, if the analog circuit is formed on the p-type silicon substrate, it becomes impossible to independently use the potential of the transistors formed in the p-type impurity layer regions, resulting in abnormal operation of the circuit.

In the device having the structure according to the first embodiment, the potential of the transistors formed on the p-type impurity layers 103, 104 and 105 deeply extended to reach the silicon substrate 101 communicates with the silicon substrate 101 through the impurity layers 103, 104 and 105. It therefore becomes substantially equivalent to the case when they are formed on a p-type silicon substrate 101 having no epitaxial layer 102. The voltage of the CMOS microcomputer circuit formed on the impurity layers 103, 104, 105, 106, 107, 108, 110 and 111 that do not reach the silicon substrate 1 can be electrically controlled independently of the silicon substrate 101, so that they become substantially equivalent to the case when formed on an epitaxial layer 102 made to serve as a substrate. Hence, the degree of freedom for the arrangement of devices becomes higher to make it possible to increase the degree of integration.

In this embodiment, the EPROM is formed on the deeply extending p-type impurity layer 103. It may alternatively formed on the deeply extending p-type impurity layer 104 or 105.

Figure 5A:
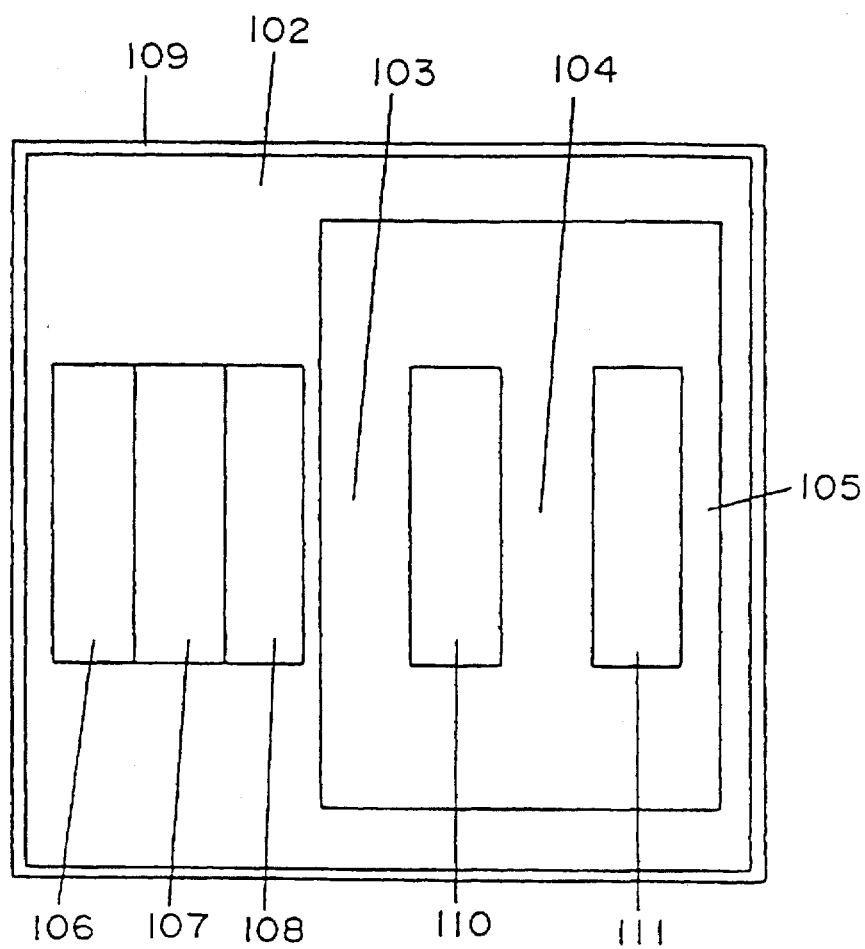
FIGS. 5(a) and FIG. 5(b) show plan views of devices, used to describe the first embodiment and a second embodiment of the present invention.
Figure 5B:
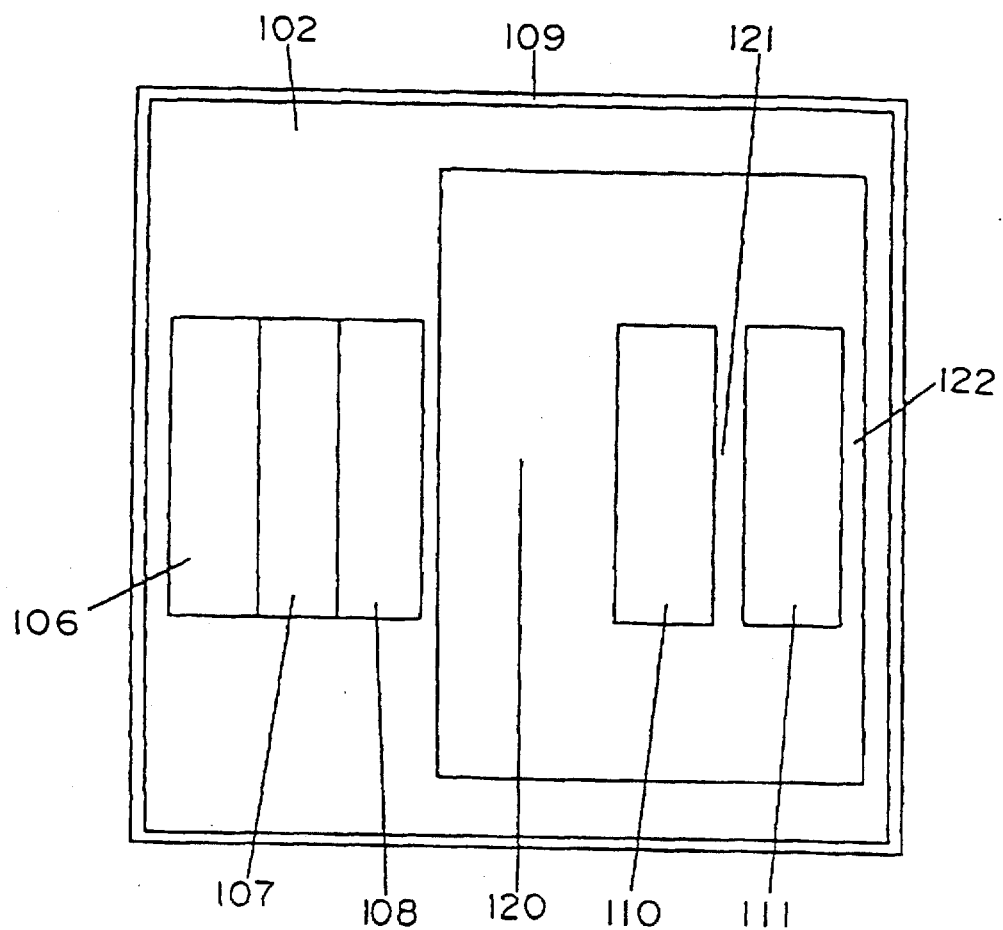

FIG. 5 shows a plan view of the device according to the present invention, to describe the first embodiment in greater detail. FIG. 5-(a) shows a plan view of the device illustrated as the first embodiment of the present invention, and FIG. 5-(b) shows a plan view of the device according to the second embodiment of the present invention.

As shown in FIG. 5-(a), the p-type impurity layer 109 that forms a scribing line is formed on the epitaxia layer formed on the p-type silicon substrate 101. At this time, the deeply extending p-type impurity layers 103, 104 and 105 are simultaneously formed, which constitute the region in which the EPROM circuit is to be formed. The regions of the p-type impurity layers 106 and 108 to be fitted thereon with n-channel transistors and the n-type impurity layers 107, 110 and 111 to be fitted thereon with p-channel transistors are formed in the region in the epitaxial layer 102, surrounded by the deeply extending p-type impurity layers 103, 104 and 105, or the region surrounded by the scribing line and defined as the epitaxial layer 102. The EPROM is formed on the deeply extending impurity layer 103. In this embodiment, the p-channel transistor that supplies a voltage of 5 V for driving the EPROM and the p-channel transistor that produces a voltage of 12.5 V to be supplied at the time of writing are respectively formed on the n-type impurity layers 110 and 111 held between the deeply extending p-type impurity layers. Besides, the n-channel transistor that comes to have the same potential as the EPROM is formed on the deeply extending p-type impurity layer 104. Within the area of the p-type impurity layer 109 corresponding to the scribing line formed at the region outside the deeply extending p-type impurity layers 103, 104 and 105, the n-channel transistors (the p-type impurity layers 106 and 108) and the p-channel transistor (the n-type impurity layer 107) formed in the region of the epitaxial layer 102 form the analog circuit.

Thus, since the deeply extending p-type impurity layers 103, 104 and 105 are used in the state wherein they communicate with the silicon substrate 101, the transistors that supply the voltage for the EPROM circuit formed on the n-type impurity layers 110 and 111 held between the respective deeply extending p-type impurity layers 103, 104 and 105 can be used in the state they are controlled to have respectively different voltages. At the time the data for the EPROM are written, a large quantity of substrate current generated in the p-type impurity layers when a relatively high voltage (about 12.5 V) is applied to bring the device into the state of writing can be flowed away to the ground through the silicon substrate 101.

The transistors formed on the p-type impurity layers 103, 104 and 105 deeply extended to reach the silicon substrate 101 are electrically connected with the silicon substrate 101 through the impurity layers 103, 104 and 105. Hence, these transistors become equivalent to those formed on a p-type silicon substrate 101 having no epitaxial layer 102. The transistors formed on the impurity layers that do not reach the silicon substrate 101 and on the epitaxial layer 102 are electrically independent of the silicon substrate 101. They therefore become equivalent to those formed on an epitaxial layer 102 made to serve as a substrate. Hence, the degree of freedom for the arrangement of devices becomes higher to make it possible to increase the degree of integration.

In reference to FIG. 5-(b), the p-type impurity layer 109 that forms a scribing line is formed on the epitaxial layer formed on an n-type silicon substrate 101. At this time, deeply extending p-type impurity layers 120, 121 and 122 are simultaneously formed, which constitute the region in which the EPROM is formed.

What is different from the construction shown in FIG. 5-(a) is that the EPROM and an n-channel transistor are formed on the deeply extending p-type impurity layer 120 and no transistors are formed on the other impurity layers 121 and 122. Such construction can be taken for the reason that, as described in reference to FIG. 5-(a), the n-channel transistor formed on the deeply extending impurity layer is used in the state having the same potential as the p-type impurity layer on which the EPROM is formed. Hence the transistor can be formed in the region of the same deeply extending p-type impurity layer.

The regions of the p-type impurity layers 106 and 108 to be fitted thereon with n-channel transistors and the n-type impurity layers 107, 110 and 111 to be fitted thereon with p-channel transistors are formed in the region in the epitaxial layer 102, surrounded by the deeply extending p-type impurity layers 120, 121 and 122, or the region surrounded by the scribing line and defined as the epitaxial layer 102.

In this embodiment, the p-channel transistor that supplies a voltage of 5 V for driving the EPROM and the p-channel transistor that produces a voltage of 12.5 V to be supplied at the time of writing are respectively formed on the n-type impurity layers 110 and 111 held between the deeply extending p-type impurity layers 120, 121 and 122. Within the area of the p-type impurity layer 109 corresponding to the scribing line formed at the region outside the deeply extending p-type impurity layers 120, 121 and 122, the n-channel transistors (the p-type impurity layers 106 and 108) and the p-channel transistor (the n-type impurity layer 107) formed in the region of the epitaxial layer 102 form the analog circuit.

Since the deeply extending p-type impurity layers 120, 121 and 122 are used in the state they communicate with the silicon substrate 101, the transistors that supply the voltage for the EPROM circuit formed on the n-type impurity layers 110 and 111 can be used in the state they are controlled to have respectively different voltages. At the time the data for the EPROM are written, a large quantity of substrate current is generated when a relatively high voltage (about 12.5 V) is applied. The substrate current, however, can be flowed away to the ground through the silicon substrate 101.

The transistors formed on the p-type impurity layers 120, 121 and 122 deeply extended to reach the silicon substrate 101 are electrically connected with the silicon substrate 101 through the impurity layers 120, 121 and 122. Hence, these transistors become substantially equivalent to the case when formed on a p-type silicon substrate 101 having no epitaxial layer 102. The transistors formed on the impurity layers that do not reach the silicon substrate 101 and on the epitaxial layer 102 become electrically independent of the silicon substrate 101. They therefore become substantially equivalent to those formed on an epitaxial layer 102 made to serve as a substrate. Hence, the degree of freedom for the arrangement of devices becomes higher to make it possible to increase the degree of integration.

Thus, compared with the construction shown in FIG. 5-(a), the construction shown in FIG. 5-(b) is different in that the n-channel transistor having the same potential as the EPROM that constitutes an EPROM circuit is formed on the same deeply extending p-type impurity layer 120. Even with such a constructional difference, however, the same effect as the effect produced by the construction shown in FIG. 5-(a) can be produced.

Interposing the n-type impurity layer 107, p-type impurity layers 106 and 108 are formed on both sides of layer 107 by implantation of boron ions. The p-type impurity layers 106 and 108 constitute part of the analog circuit. In this embodiment also, the deeply extending p-type impurity layer 120 and the p-type impurity layer 108 that from the analog circuit are not in contact with each other and are formed in such a fashion that the epitaxial layer 102 lies between both the impurity layers. Both of these impurity layers 102 and 108, however, may be in contact, but preferably be not in contact. Namely, if both p-type impurity layers 106 and 108 come into contact, the p-type impurity layer 108 has the same potential as that of the p-type impurity layer 120 and that of the p-type silicon substrate 101. Hence in the analog circuit formed on the p-type silicon substrate 108 the potentials of the p-type impurity layer regions within the area of the silicon substrate 101 are all grounded, so that it becomes impossible to independently control the voltage, resulting in no normal operation of the circuit.

Figure 6:
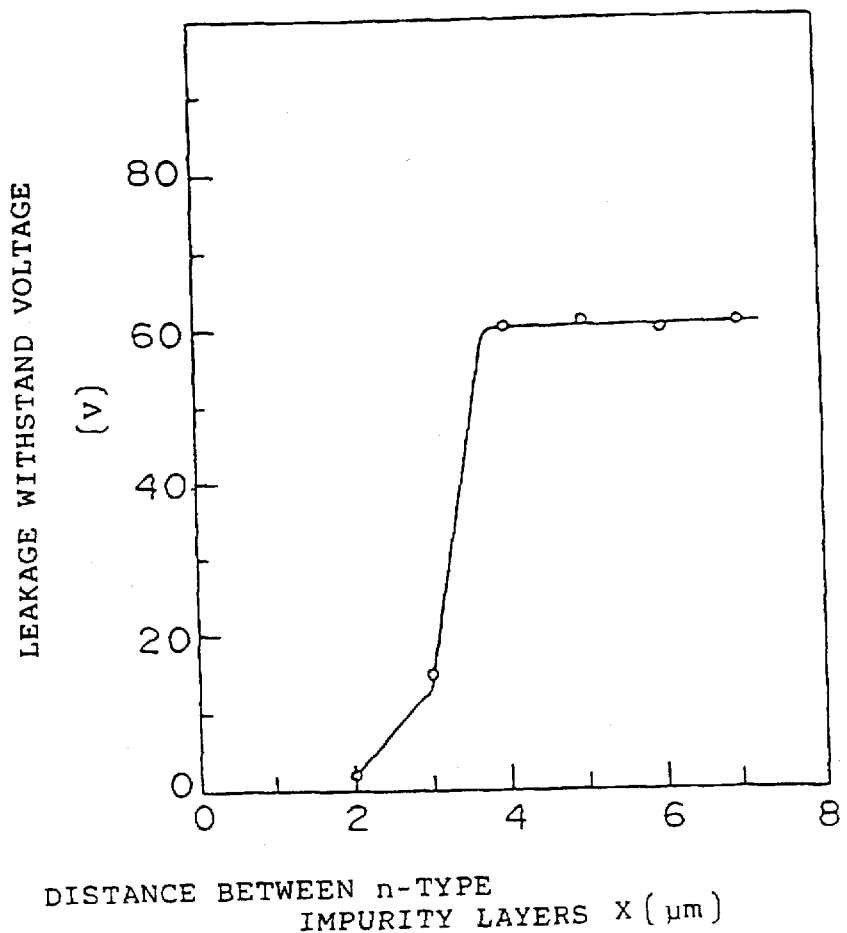
FIG. 6 is a view to show the leakage withstand voltage of the devices according to the present embodiments.

FIG. 6 shows the withstand voltage characteristics of the n-type impurity layers 110 and 111 surrounded by the deeply extending p-type impurity layers 103, 104 and 105 in the device shown in FIG. 5-(a). The ordinate indicates the absolute value of withstand voltage, and the abscissa the width (X) of n-type impurity layer.

This shows that the withstand voltage at which about 0.1 μA of leakage current is generated comes to be 10 V or less when the distance between the n-type impurity layer is about 3 μm or less. When, however, the distance between the n-type impurity layer is about 4 μm or more, the layer has a withstand voltage high enough for the use of two electric source voltages, so that the EPROM can be operated between the n-type impurity layer to which 5 V of driving voltage is applied and the n-type impurity layer to which 12.5 V is applied, without influence on the withstand voltage between devices.

Figure 7:
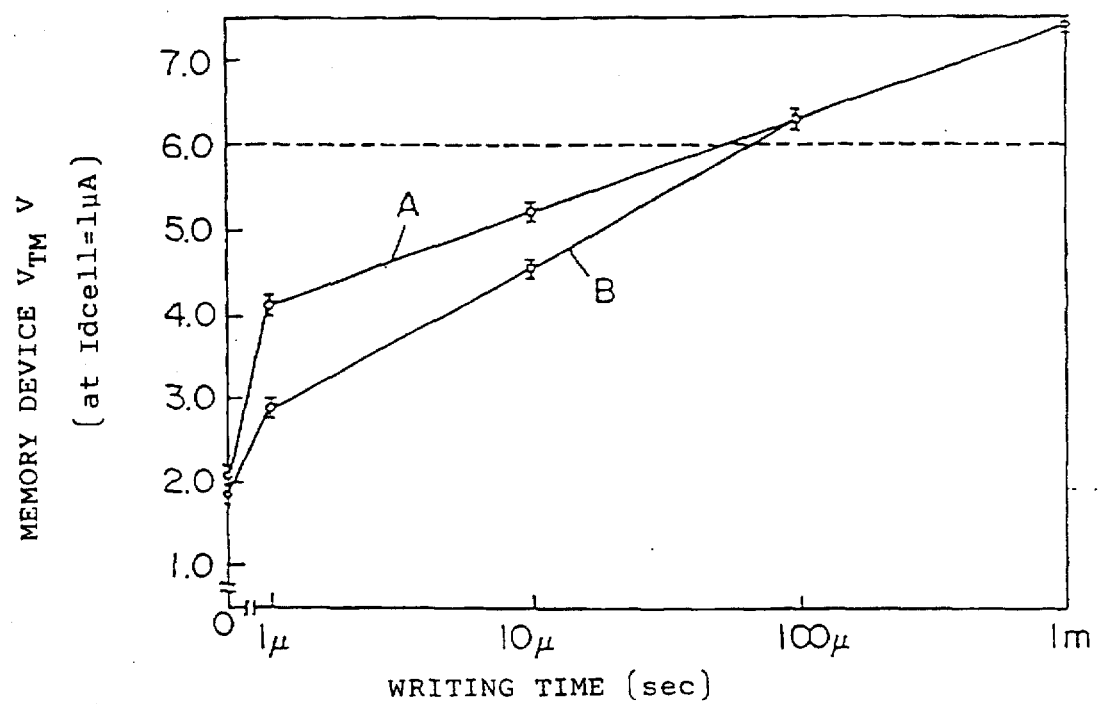
FIG. 7 is a view to show the writing characteristics of EPROMs according to the present embodiments.

FIG. 7 shows writing characteristics of the EPROM device shown in FIG. 5-(a). The letter symbol A shown in FIG. 7 represents the characteristics of the EPROM device formed on a p-type substrate, and B the characteristics of the EPROM device formed on the p-well. The ordinate indicates the amount of changes of threshold voltage ($V_{TN}$) of the device for carrying out writing, and the ordinate the writing pulse time.

The characteristics of an EPROM formed on a p-type silicon substrate prepared using a conventional technique are shown together for the sake of reference.

As to the evaluation on writing characteristics, judgement is made based on the pulse time taken when the threshold voltage ($V_{TN}$) of the EPROM reaches 6 V. More specifically, when the threshold voltage ($V_{TN}$) of the EPROM is 6 V, the EPROM is in the state of no communication even if an electric source voltage of 5 V is applied to the EPROM. Thus, at the time the information is written in the EPROM, the EPROM is so kept that it may not operate as a usual n-channel transistor because of the application of the electric source voltage to the EPROM.

As will be seen from FIG. 7, the EPROM formed on a p-type silicon substrate, and the EPROM formed on the p-type epitaxial layer as in the present invention, can obtain substantially equal characteristics when the writing time is about 70 μsec.

Figure 8:
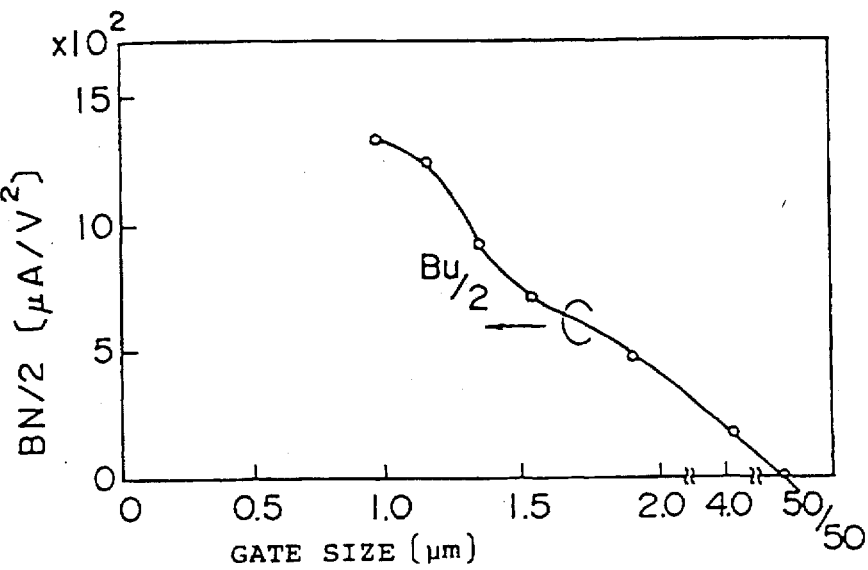
FIG. 8(a) and 8(b) present graphs to show the relations of mutual conductance and threshold value with respect to gate size in the present embodiments.
Figure 8:
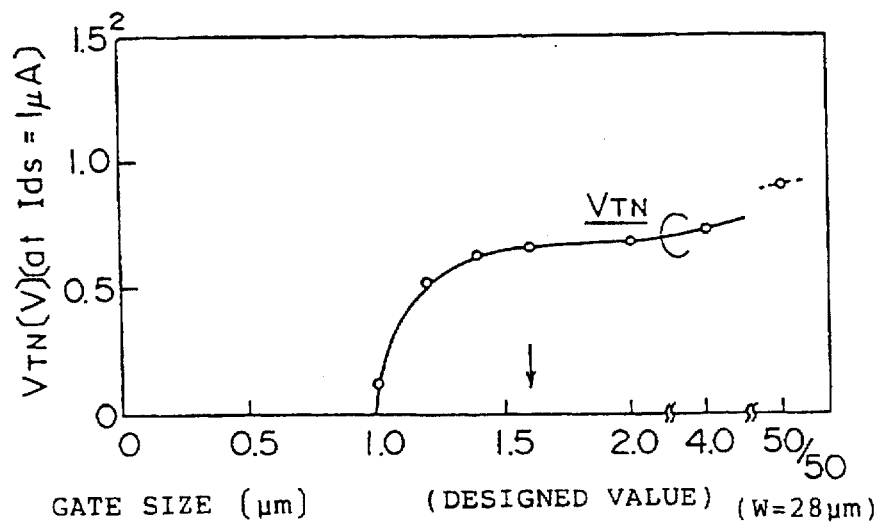

FIG. 8 shows the relations of threshold voltage ($V_{TN}$) with respect to the gate size of an n-channel transistor that constitutes an analog circuit, and mutual conductance $\beta N/2$ with respect to the gate size.

The magnitude of the short-channel effect of the n-channel transistor can be known from the relations of the threshold voltage ($V_{TN}$) and mutual conductance with respect to the gate size.

The threshold voltage ($V_{TN}$) abruptly decreases when the gate size is 1.5 μm or less to produce the short-channel effect. Similarly, the mutual conductance abruptly increases also when the gate size is 1.5 μm or less. It is seen from these facts that a stable operation can be attained when the gate size of the n-channel transistor is in the range of 1.6 μm or more. In this respect, quite equal characteristics are obtained even when compared with examples of conventional n-channel transistors.

It is seen from the above that the circuit comprising the epitaxial layer in which the impurity layers deeply extended to reach the silicon substrate is substantially equivalent to the case when formed on a p-type silicon substrate having no epitaxial layer, and also that the circuit formed on the impurity layers that do not reach the silicon substrate and on the epitaxial layer 102 becomes electrically independent of the silicon substrate and is substantially equivalent to the case when formed on an epitaxial layer made to serve as a substrate. In addition, formation of devices having such construction brings about an increase in the degree of freedom for designing.

Figure 9:
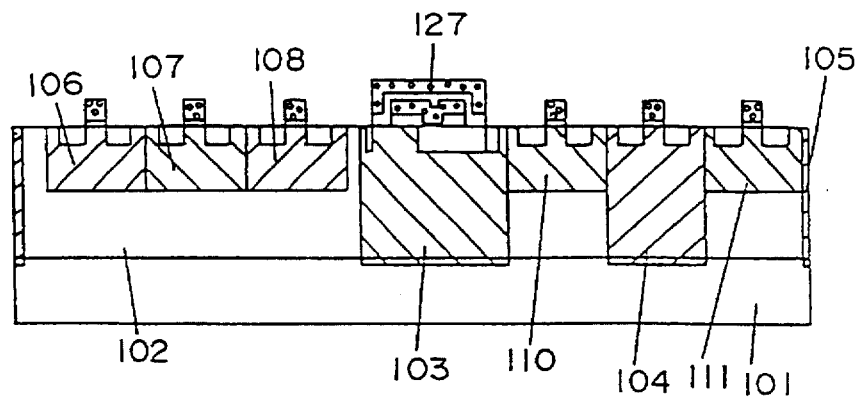
FIG. 9(a)–9(c) show cross-sectional views of devices in each of which an analog circuit and a static RAM or a dynamic RAM are formed on the same chip.
Figure 9:
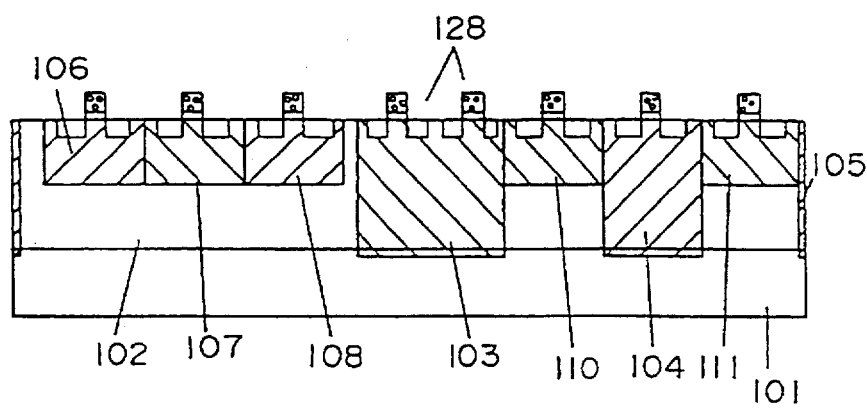
Figure 9:
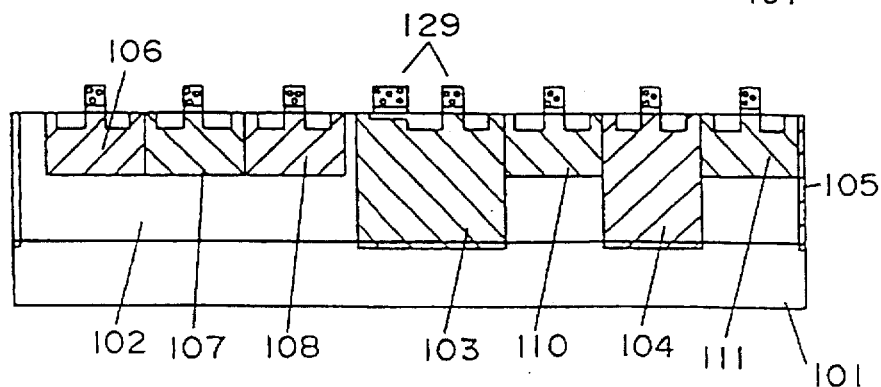
Figure 10A:
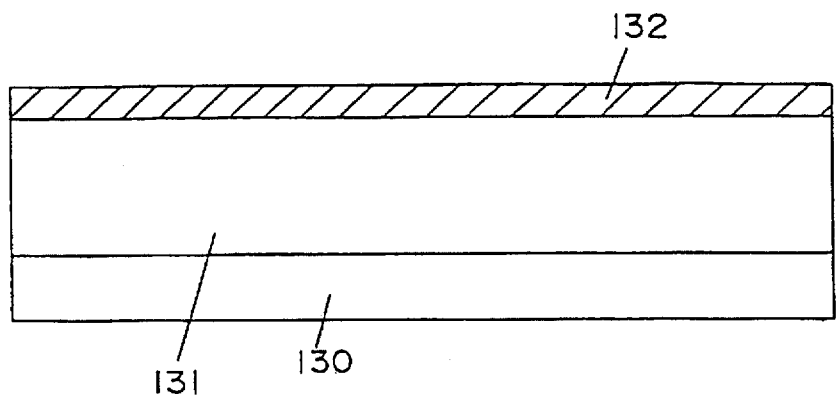
FIG. 10(a)–10(g) are cross-sectional process charts to illustrate the process of manufacturing the device of the present invention.
Figure 10B:
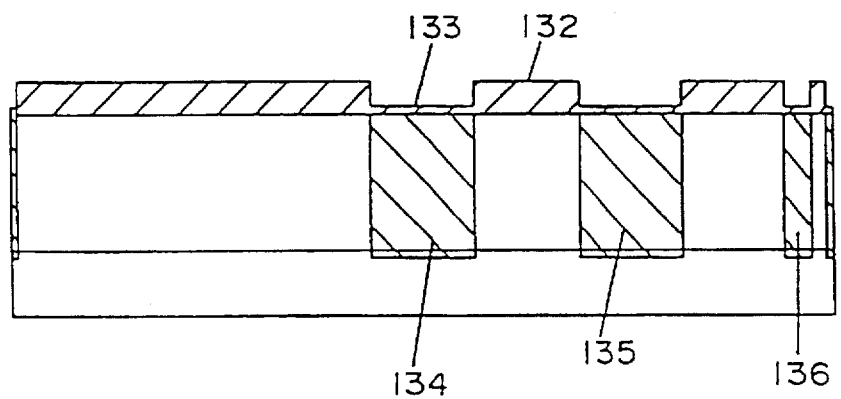
Figure 10C:
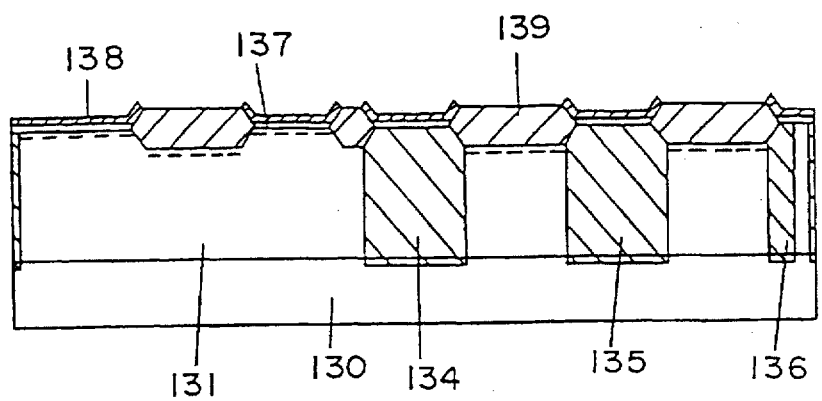
Figure 10D:
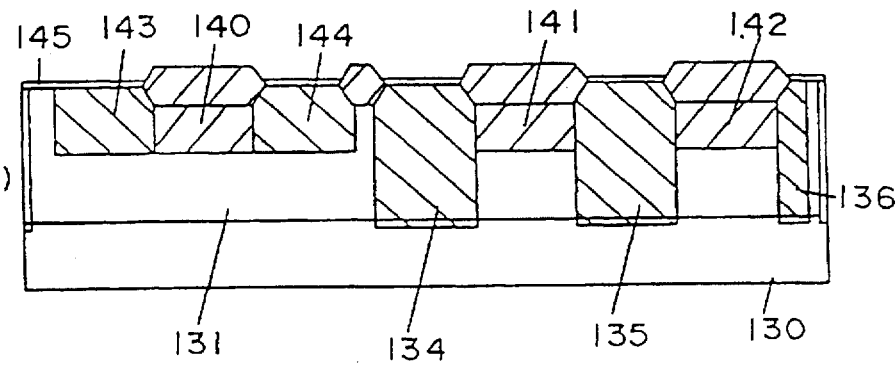
Figure 10E:
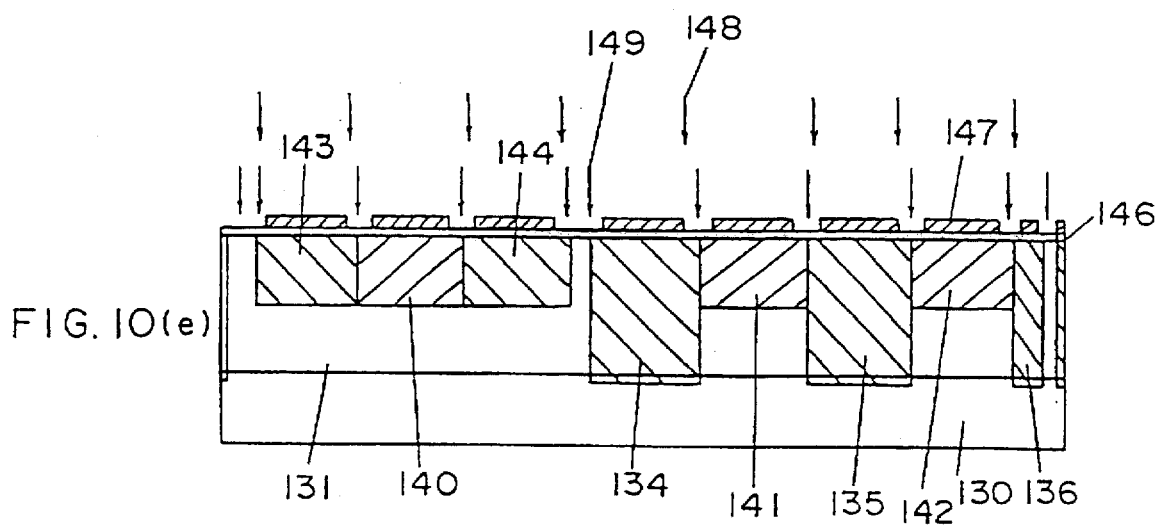
Figure 10F:
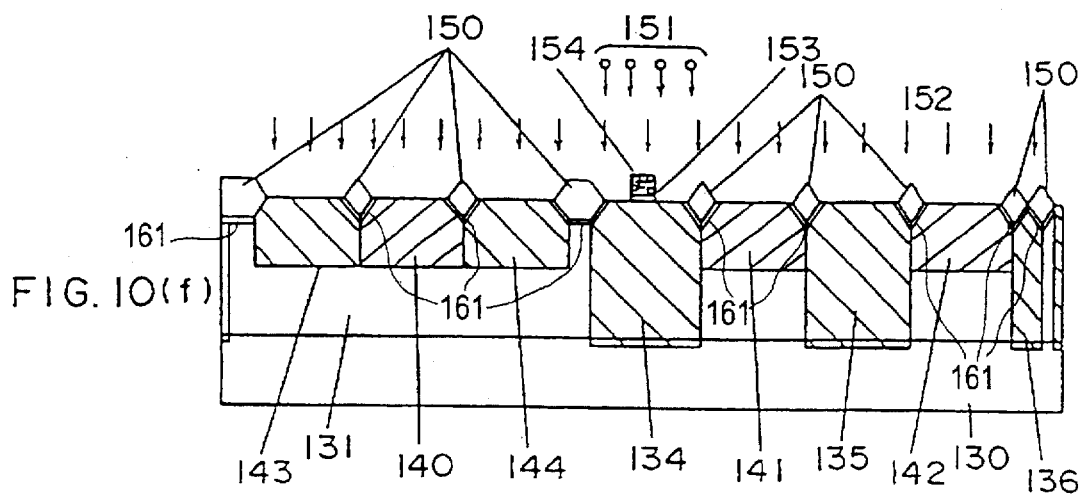
Figure 10G:
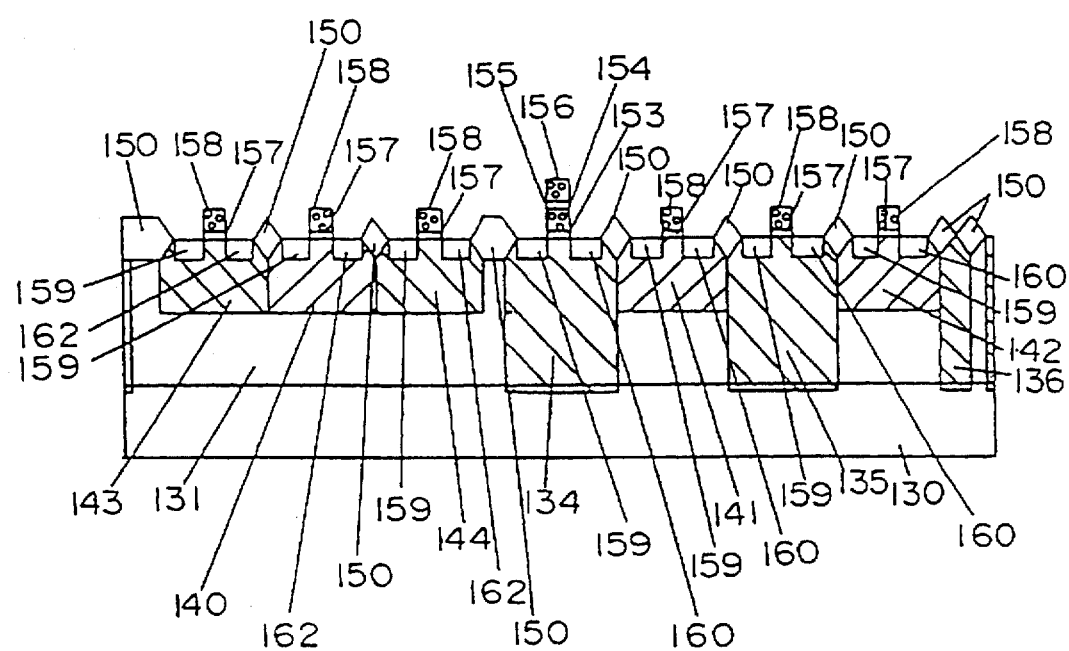

FIG. 9 shows cross-sectional views of devices in which an EEPROM (electrically erasable programmable ROM) 127, a static RAM 128 and a dynamic RAM 129, respectively, making use of a p-type silicon substrate are used in place of the EPROM, which are each formed on the same chip on which an analog circuit is formed.

The constitution of the p-type silicon substrate 101, n-type epitaxial layer 102, deeply extending p-type impurity layers 103, 104 and 105, n-type impurity layers 106, 108, 110 and 111, and p-type impurity layer 107 is the same as that in FIG. 4 illustrating the first embodiment.

What is different from the constitution of the device of FIG. 4 is that the EPROM formed on the deeply extending p-type impurity layer 103 in the first embodiment was replaced with the EEPROM 127, the static RAM 128 or the dynamic RAM 129.

In reference to FIG. 9-(a), an EEPROM is mounted in place of the EPROM used in the first embodiment.

In reference to FIG. 9-(b), a static RAM is mounted in place of the EPROM.

In reference to FIG. 9-(c), a dynamic RAM is mounted in place of the EPROM.

In the EEPROM, like the EPROM, it is required that the potential of the transistors for driving the EEPROM can be independently controlled. Hence it is effective to take the constitution as in the present embodiment.

In the static RAM or dynamic RAM, it is proposed to use a driving voltage controlled to a low level (for example, about 2.5 V), on account of the achievement of high density of devices. For this low voltage, an electric source voltage of 5 V is supplied to a device, and then supplied after it has been lowered in the interior of the device. Hence, it must be possible to use different voltages on one chip. The construction as shown in FIG. 9-(c) or (c) is effective for the devices so constituted that the voltage is lowered using a voltage-lowering circuit formed on one chip.

FIG. 10 shows a cross-sectional process chart to illustrate the process of manufacturing the device according to the first embodiment.

Using reduced pressure CVD, an n-type (100) epitaxial layer 131 of about 10 µm in film thickness is formed on a p-type 10 to 15 Ωcm (100) silicon substrate 130. Thereafter, using thermal CVD, an oxide film 132 of 0.6 µm in film thickness is formed on the epitaxial layer 131 (FIG. 10-(a)).

Here the epitaxial layer 131 is made to grow under conditions of a gas pressure of about 80 Torr, a growth temperature of about 1,080° C. and a growth time of about 20 minutes, using arsine (AsH$_2$), dichlorosilane (SiH$_2$Cl$_2$) and hydrogen (H$_2$) as gas species.

The thermal oxide film 132 is made to grow under conditions of a gas flow rate of 12 lit/min, a growth temperature of about 1,000° C. and a growth time of 2 hours, using a mixed gas of hydrogen (H$_2$) and (O$_2$) as gas species.

The film thickness of the epitaxial layer 131 influences the characteristics of the device formed in the subsequent step. The film thickness of the epitaxial layer 131 also depends on the diffusion time required for deeply extending p-type impurity layers to be diffused to the silicon substrate 130 in a later step.

Next, a resist is coated and baked, and then the resist at the region in which p-type impurity layers deeply extended to reach the silicon substrate 130 are formed is exposed to light and developed to form a resist pattern (not shown in the drawing). Thereafter, using the resist as a mask, the oxide film corresponding to resist openings are wet-etched by the use of a mixed solution containing hydrofluoric acid and ammonium fluoride. At this time, the oxide film 132 is etched in such a way that its remaining film has a thickness of about 0.1 µm, after the oxide film 132 is completely removed the resist is removed to form the oxide film 132 of about 0.1 µm thick over the whole surface of the silicon substrate 130. In this embodiment, the latter method is used.

Next, boron ions are implanted in the silicon substrate 130. Thereafter, deeply extending p-type impurity layers 134 and 135 are formed by annealing. The remaining film of resist pattern is removed by etching (FIG. 10-(b)).

The boron ion implantation is carried out at an accelerating voltage of 50 keV and an implantation rate of 2×10$^{12}$/cm$^2$. Under the accelerating voltage kept at about 50 keV, ions penetrate the regions having an oxide film thickness of 0.1 µm among oxide films 132 and 133 and enter the silicon substrate 130. At the part of the oxide film having a large thickness, however, the boron ion-planted into the oxide film 132 stop there and do not enter the silicon substrate 130.

The annealing is carried out in order to activate the boron added by ion implantation. At this time, deeply extending p-type impurity layers 134, 135 and 136 are formed as a result of the activation of boron. In order for the deeply extending p-type impurity layers 134, 135 and 136 to reach the silicon substrate 130 by annealing, the annealing is carried out at an annealing temperature of about 1,200° C. and an annealing time of about 25 hours.

Here it is necessary to set the conditions for the boron ion implantation and conditions for the annealing so that the device formed in the subsequent step can have the desired characteristics. In particular, since the annealing conditions are important factors for determining the depth of diffusion of impurities, the distribution of impurities and the efficiency of device manufacture, it is necessary to use appropriate values.

Namely, if the ion implantation is carried out at a low accelerating voltage, the ions added by ion implantation are distributed over the surface of the epitaxial layer 131. Hence the annealing conditions are restricted. In addition, the impurities may be greatly diffused in the direction parallel to the epitaxial layer 131. On the other hand, if the ion implantation is carried out at a high acceleration, the impurities may be locally distributed at a deep position from the surface of the epitaxial layer 131. This brings about non-uniform impurity distribution from the surface of the epitaxial layer 131, resulting in a degradation of characteristics of the device finally formed. In view of the relation between the both, the accelerating voltage was set to be 50 keV as an optimum value.

The rate of implantation of boron by the ion implantation must be so controlled that the impurity density at the interfaces between the silicon substrate 130 and the p-type impurity layers 134, 135 and 136 is about 1×10$^{15}$/cm$^2$ or more in order for the p-type impurity layers 134, 135 and 136 and the silicon substrate 130 to be brought into an electrically communicating state. This is due to the requirement that the boundary of impurity density between the silicon substrate 130 and the n-type epitaxial layer 131 should be prevented from being moved because of the diffusion of impurities by heat treatment.

The distribution of impurity density, obtained by ion implantation and annealing, can be determined by the expression shown below.

$$Q(x,t) = [Q_0/(\pi Dt)^{1/2}]\exp(-x^2/4Dt)$$
$$D = D_0 \exp(-W/kT)$$

wherein Q$_0$ is the total quantity of impurities, t is diffusion time, x is the distance at which impurities have been diffused, D is the coefficient of diffusion, T is annealing temperature, and W is activating energy.

As will be seen from this expression, in the case when the impurity density at the interface of the silicon substrate 130 is set to be not less than a given value, the impurity density can be increased to the given value by controlling the annealing time and annealing temperature. However, the annealing time and annealing temperature increase is an inversely exponential functional manner with respect to the impurity density. Hence it is not a practical method to bring the impurity density into the desired value by changing the annealing conditions. Then, it is preferred to bring the impurity density at the interface of the silicon substrate 130 into the desired value or more by increasing the rate of implantation at the time of the boron ion implantation. If, however, the rate of implantation becomes excessively high, even such a method may result in a large amount of changes in impurity density in the depth direction of the p-type impurity layers 134, 135 and 136 even if the annealing is carried out. This causes the degradation of characteristics of the device formed in the subsequent step. Ion implantation conditions determined by taking account of these may be an accelerating voltage of 50 keV or more and an implantation rate of $2 \times 10^{13}/cm^2$ or more.

Referring next to the annealing conditions, it is necessary to set the temperature and time at and for which the ions are activated and are sufficiently diffused into the film thickness of the epitaxial layer 131. As conditions for giving an impurity density of about $1 \times 10^{15}/cm^2$ or more at the interface of the silicon substrate 130, the annealing may be carried out at an annealing temperature of 1,200° C. for 25 hours or more, so that the p-type impurity layers 134, 135 and 136 each having a sufficient diffusion depth and communicating with the silicon substrate 130 can be formed.

The ion implantation and annealing carried out under such conditions cause the impurities to diffuse toward the surface of the epitaxial layer 131 by the action of heat. The impurities further reach the surface of the epitaxial layer 131 until they slip away from the surface. Hence the impurity density is lowered at the surface of the epitaxial layer 131 (i.e., outward diffusion). Here, however, the impurity density at the surface of the silicon substrate 130 is never lowered because the oxide film 133 of about 0.1 μm in film thickness is formed on the surface of the epitaxial layer 131.

The width of the resist pattern used for forming the p-type impurity layers 134, 135 and 136 that reach the silicon substrate 130 is diffused in the lateral direction by about 80% of the depth direction, i.e., about 8 μm, at the same time when the boron is diffused by about 10 μm in the depth direction of the epitaxial layer 131. Hence, it is necessary to set the width of the resist pattern taking account of the distance at which the impurities are diffused in the lateral direction.

Thereafter, the whole of the oxide films 132 and 133 on the epitaxial layer 131 are removed. Thereafter, a protective oxide film 137 of about 0.05 μm in film thickness is formed by thermal CVD. Next, a nitride film of about 0.12 μm in film thickness is formed on the oxide film 137 by reduced pressure CVD. Thereafter, a resist is coated on the nitride film 138 and then baked. The regions surrounded by the deeply extending p-type impurity layers 134, 135 and 136 and the n-type impurity layer regions in which p-channel transistors are formed on the epitaxial layer 131 are exposed to light and developed to form a resist pattern. Using this resist pattern as a mask, the nitride film 138 is dry-etched by the use of a fluorine gas so that the surface of the epitaxial layer 131 is uncovered. Thereafter, phosphorus ion implantation is carried out.

Next, the resist pattern is removed. Thereafter, an oxide film 139 of about 0.6 μm in film thickness is formed by CVD. Next, boron ion implantation is carried out FIG. 10-(c)).

Thereafter, for the purpose of activating phosphorus ions and boron ions, heat treatment is carried out at an annealing temperature of 1,200° C. for 5 hours (FIG. 10-(d)).

Here, the phosphorus ion implantation is carried out at an accelerating voltage of 100 keV and an implantation rate of about $8 \times 10^{12}/cm^2$.

When the accelerating voltage is made as high as 100 keV in this way, the phosphorus ions implanted into the epitaxial layer 131 have the distribution that may give a maximum impurity density at a deep position in the interior of the epitaxial layer 131.

Using this phosphorus ion implantation, n-type impurity layers 140, 141 and 142 are prepared on which p-channel transistors are to be formed. After the phosphorus ion implantation, an oxide film 139 of about 0.6 μm in film thickness is formed so that the tops of the n-type impurity layers 140, 141 and 142 are covered. Thereafter, p-type impurity layers 143 and 144 on which n-channel transistors are to be formed adjoiningly to given n-type impurity layers 140, 141 and 142 are formed by boron ion implantation using the oxide films as masks.

In usual instances, in such a step, phosphorus ion implantation is carried out at an accelerating voltage of from 30 to 50 keV and thereafter a resist is again coated to form a resist pattern in the region in which the p-type impurity layers 143 and 144 are to be prepared. In such a method, however, the positions at which the p-type impurity layers 143 and 144 are to be formed depend on the accuracy of superposing the exposure when the resist pattern is formed, and it is therefore difficult to readily form the p-type impurity layers 143 and 144 in the state they are precisely adjoined to the n-type impurity layer 140.

After the phosphorus ion implantation, the oxide film 139 of about 0.6 μm in film thickness is formed. The thermal oxide film 139 is formed under the following growth conditions. Using a mixed gas of hydrogen ($H_2$) and oxygen ($O_2$) as gas species, the film is formed at a gas flow rate of 12 lit/min for the mixed gas, a growth temperature of about 1,000° C. and a growth time of 2 hours. The oxide film 139 is made to grow at such a high temperature and thus the impurities present in the epitaxial layer 131 can be diffused. The oxide film 139 thus formed is formed in the state oxygen has been added to silicon. Hence, the oxide film 139 is formed in the state it is embedded to the level of about 0.2 μm from the surface of the epitaxial layer 131. At this time, it follows that the impurities present at the oxidized part are incorporated into the oxide film 139.

Since the impurities present in the epitaxial layer 131 are incorporated into the oxide film 139, the impurities are present at the surface of the epitaxial layer 131. In such a state, the impurity distribution in the n-type impurity layers 140, 141 and 142 can not be set to the predetermined values. Hence, the phosphorus ion implantation is carried out at an accelerating voltage if 100 key and thus the oxide film 139 is formed, so that the quantity of the impurities necessarily incorporated into the oxide film 139 can be decreased. Hence it is possible to form the n-type impurity layers 140, 141 and 142 having the predetermined impurity densities.

In addition, since the phosphorus ion implantation is carried out at a high acceleration, the film thickness of the resist pattern formed in the region in which no impurities are implanted is required to be 1.0 μm or more.

The phosphorus ions implanted at a high acceleration are further activated and diffused through the step of forming the oxide film 139 here and by annealing, thus forming the n-type impurity layers 140, 141 and 142. At this time, the depth from the surfaces of the n-type impurity layers 140, 141 and 142 to the bottoms of the n-type impurity layers 140, 141 and 142 in the interior of the epitaxial layer 131 is about 5 μm.

Here, the oxide film 137 is made to grow under conditions of a gas flow rate of 12 lit/min, a growth temperature of about 1,000° C. and a growth time of 2 hours, using a mixed gas of hydrogen ($H_2$) and oxygen ($O_2$).

The nitride film 138 is also made to grow under conditions of a growth temperature of about 600° C. and a growth time of 40 minutes, using a mixed gas of silane ($SiH_4$), ammonia ($NH_3$) and nitrogen ($N_2$).

The dry etching of the nitride film 138 was carried out using plasma of a mixed gas of Freon ($CF_4$) and oxygen ($O_2$).

The oxide film 137 used here plays a role of protecting the surface of the epitaxial layer 131 when the ion implantation is carried out, and may have a film thickness of from 0.02 μm to 0.05 μm in approximation.

Before the boron ion implantation is carried out, the nitride film 138 is removed. Next, over the whole surface of the epitaxial layer 131, a protective oxide film 145 is made to grow to have a film thickness of about 0.05 μm. Thereafter, the p-type impurity layers 143 and 144 on which n-channel transistors are to be formed adjoiningly to the given n-type impurity layer 140 are formed in self alignment. In this way, the p-type impurity layers 143 and 144 are formed by the boron ion implantation using the oxide film 139 as a mask.

The p-type impurity layers 143 and 144 are formed by the ion implantation of boron at an accelerating voltage of 50 keV and an implantation rate of 8 to $10 \times 10^{12}/cm^2$. The reasons why the conditions under which the boron ion implantation is carried out are set in this way are that the ions can be prevented from penetrating the oxide film 139 serving as the mask for the n-type impurity layer 140, and that the boron ion implantation and annealing can facilitate the formation of p-type impurity layers 143 and 144 having uniform impurity density distribution as far as possible in the depth direction. Namely, at a high acceleration, the impurity density is distributed to a deep position in the interior of the epitaxial layer 131 as previously described. Also after the annealing, the impurity density becomes lower at the surface of the epitaxial layer 131 facing the p-type impurity layers 143 and 144 and at the bottom of the p-type impurity layers 143 and 144 formed in the interior of the epitaxial layer 131. Hence, this may cause the degradation of characteristics of the device formed on the p-type impurity layers 143 and 144 in the subsequent step.

In the manner as described above, the p-type impurity layers 143 and 144 are formed by ion implantation followed by annealing, to extend to a depth of about 5 μm from the surface of the epitaxial layer 131.

The p-type impurity layers 143 and 144 in the n-type epitaxial layer 131, thus formed, are electrically separated from the p-type silicon substrate 130.

Since the p-type impurity layers 143 and 144 are also formed in self alignment with the n-type impurity layer 140, the p-type impurity layers 143 and 144 can be formed in a good accuracy. It is also possible to prevent the process from being complicated.

However, the n-type impurity layer 140 and p-type impurity layers 143 and 144 formed on the n-type epitaxia layer 131 in this step may not necessarily be formed adjoiningly to each other. More specifically, the characteristics of the device to be finally formed can not be degraded even when a region of the n-type epitaxial layer 131 is formed between the n-type impurity layer 140 and the p-type impurity layers 143 and 144 or between the p-type impurity layers 143 and 144.

Next, the oxide film 139 and the oxide film 145 are completely removed by wet etching. Thereafter, a protective oxide film 146 is made to grow by CVD to have a film thickness of about 0.05 μm. Next, a nitride film 147 of about 0.12 μm in film thickness is formed on the protective oxide film 146 by reduced pressure CVD. Thereafter, using conventional photolithography and dry etching, windows of a resist pattern (not shown in the drawing) are made at given regions of the nitride film 147. Thereafter, ion implantation of boron 148 is carried out. Next, the resist pattern is removed, and, using again photolithography, a resist pattern (not shown in the drawing) is formed in the regions of the n-type impurity layers 140, 141 and 142. In such a state, ion implantation of phosphorus 149 is again carried out on the whole surface. The resist pattern formed on the surface is thereafter removed (FIG. 10-(e)).

Here, the first ion implantation of the boron 148 forms a film 150 at the region in which an LOCOS oxide film (a separating oxide film) formed in the subsequent step is to be formed, which film plays a role as a channel stopper 161. More specifically, the LOCOS oxide film 150 is formed in the regions defined between the p-type impurity layers 134, 135, 136, 143 and 144 and the n-type impurity layers 140, 141 and 142, and between the p-type impurity layers 134, 136, 143 and 144 and the epitaxial layer 131. It is prepared for the purpose of preventing electrical leakage that may be produced between those impurity layers.

The boron ion implantation is carried out under conditions of an accelerating voltage of 50 keV and an implantation rate of 2 to $3 \times 10^{13}/cm^2$.

Thereafter, the LOGOS oxide film 150 is formed to have a film thickness of about 0.7 μm. Next, ion implantation of boron 151 into the p-type impurity layer 134 on which an EPROM is to be formed is carried out in order to obtain the writing characteristics of the EPROM. Ion implantation of boron 152 is further carried out over the whole surface of the epitaxial layer 131. Next, a gate oxide film 153 of 0.03 μm in film thickness is formed on the surface of the p-type impurity layer 134 on which the EPROM is to be formed. Next, a gate electrode 154 of about 0.4 μm in film thickness, made of polysilicon, is formed on the gate oxide film 153. The gate oxide film 153 and the gate electrode 154 are formed by conventional CVD, and thereafter the pattern formation for the gate oxide film 153 and the gate electrode 154 is carried out by photolithography and dry etching. The gate electrode 154 is doped with phosphorus to decrease the resistance ascribable to the polysilicon, and then used (FIG. 10-(f)).

The ion implantation of the first boron 151 is carried out to form a channel for the EPROM. This ion implantation is carried out under conditions of an accelerating voltage of 50 keV and an implantation rate of $1 \times 10^{12}/cm^2$ When the channel for the EPROM is formed, the impurity density thereof comes to be about $6 \times 10^{16}/cm^2$.

Here, channels for n-channel transistors are formed with the impurity density attributable to the boron that forms the p-type impurity layer 134 in the previous step, the impurity density attributable to the boron 151 added here by ion implantation, and also the impurity density given by the second ion implantation of the boron 152. Thus, boron impurities are implanted three times in the region in which the EPROM is to be formed.

The boron 152 added by ion implantation to the whole surface of the epitaxial layer 131 forms the channels for n-channel transistors, and determines the threshold voltage of the n-channel transistors. At this time, the boron 152 added by ion implantation to the whole surface of the epitaxial layer 131 governs the threshold voltage of the n-type transistors formed on the p-type impurity layers 143 and 144 of the analog circuit portion and also the threshold voltage of the p-type transistors formed on the n-type impurity layers 135 and 140. Hence, the rate of implantation for the ion implantation in the whole surface of the epitaxial layer 131 must be kept constant and, before the step of ion implantation of the boron 152 is carried out, the impurity densities at the channel portions, corresponding with the threshold values of the respective transistors, must be previously accurately controlled.

On the other hand, the device can be stably formed by keeping constant the rate of implantation for the ion implantation in the whole surface of the epitaxial layer 131. Namely, if the rate of ion implantation at the channel portions of the respective transistors is not controlled before the ion implantation of the boron 152, the impurity density must be adjusted by implanting ions at an optimum rate in the ion implantation of the boron 152 for each transistor. In such an instance, the step of photolithography and the step of ion implantation are required in the number corresponding to the kind and number of the transistors to be formed, bringing about a complicated process. In addition, this results in a lowering of reliability on the formation of each transistor. For example, since the LOCOS oxide film 150 is formed on the surface of the epitaxial layer 131, there are irregularities produced on the surface. Hence, the thickness of the resist formed to carry out photolithography may differ in some places to make it difficult to form a stable pattern. The form of the surface of the epitaxial layer 131 also has a great influence on the reliability in the formation of devices.

For the reasons as stated above, the ion implantation of the boron 152 is carried out under constant conditions so that transistors having the desired threshold values can be obtained.

More specifically, the impurity density is so set that the transistors may have a threshold value of 0.7 V, and the ion implantation of the boron 152 in the surface of the epitaxial layer 131 is so designed as to be carried out at an accelerating voltage of 50 keV and an implantation rate of about 2.2 to $2.5 \times 10^{12}/cm^2$.

In the above conditions, in order to give the threshold voltage of 0.7 V for the n-channel transistor formed on the deeply extending p-type impurity layer 136 at the part of the EPROM circuit, the p-type impurity layer 136 must be implanted with ions at an accelerating voltage of 50 keV and an implantation rate of about 2 to $3 \times 10^{13}/cm^2$.

In order to give the threshold voltage of 0.7 V for the n-channel transistors formed on the p-type impurity layers 143 and 144, the p-type impurity layers 143 and 144 must be implanted with ions at an accelerating voltage of 50 keV and an implantation rate of about 8 to $10 \times 10^{12}/cm^2$.

Besides, in order to give the threshold voltage of 0.7 V for the p-channel transistors formed on the n-type impurity layers 140, 141 and 142, the n-type impurity layers 140, 141 and 142 must be implanted with phosphorus ions at an accelerating voltage of 100 keV and an implantation rate of about $8 \times 10^{12}/cm^2$.

Thereafter, gate oxide films and gate electrodes of n-channel transistors and p-channel transistors are formed at given positions. In regard to the EPROM, the gate oxide film 153 of about 0.03 µm in film thickness is formed from the surface side of the p-type impurity layer 134. Thereafter, a floating gate electrode 154 for accumulating electric charge is formed using polysilicon to have a film thickness of about 0.3 µm. A silicon oxide film 155 of about 0.04 µm in film thickness, serving as an insulating film for retaining electric charge, is further formed by thermally oxidizing the polysilicon, and then a gate electrode 156 that controls the EPROM as a transistor is formed on the uppermost layer to have a film thickness of about 0.4 µm. Each polysilicon is doped with phosphorus to decrease its resistance.

In regard to the n-channel transistors, a gate oxide film 157 of about 0.025 µm in film thickness is simultaneously formed from the surfaces of the p-type impurity layers 136, 143 and 144, and in regard to the p-channel transistors, from the surfaces of the n-type impurity layers 140, 141 and 142. Subsequently, a gate electrode 158 of about 0.4 µm in film thickness is formed using polysilicon. The polysilicon is doped with phosphorus to decrease its resistance, like the case of the EPROM.

After the gate electrodes 154, 156 and 158 of the respective transistors have been formed, a resist pattern is formed in a given region by photolithography and then dry etching is carried out using gas plasma and using the resist pattern as a mask. As a result, the polysilicon at the region other than the resist pattern is etched to give the shapes of nearly vertical side walls. Thereafter, sources 159 and drains 160 are respectively formed by ion implantation to form the EPROM, the n-channel transistors and the p-channel transistors (FIG. 10-(g)).

There are two ways as methods of lowering the resistance of the polysilicon. According to the first method, polysilicon film containing no impurities is formed by CVD and thereafter impurities are introduced into the polysilicon by ion implantation. Thereafter, a heat treatment is applied so that the impurities may be uniformly diffused into the polysilicon film.

The second method is a method in which impurities are simultaneously added at the time the polysilicon film is formed. In usual instances, the polysilicon film is formed by thermally decomposing a silane gas. At this time, a gas containing impurities, such as silane-diborane, silane-arsine or silane-phosphine, may be simultaneously fed as a reactive gas to carry out thermal decomposition. The polysilicone film uniformly containing impurities can be thus formed.

To form the source 159 and drain 160, elements such as phosphorus and arsenic that form the n-type impurity layers are added by ion implantation in the case of the deeply extending p-type impurity layer 135 on which the EPROM is to be formed or the p-type impurity layer 136 on which the n-channel transistor is to be formed. For the formation of the source 159 and drain 160 of p-channel transistors, elements such as boron that form the p-type impurity layers are added to the n-type impurity layers 106, 108, 110 and 111 by ion implantation.

Here, when the electric source voltage of the EPROM is 5 V and the writing voltage is 12.5, the p-channel transistor of the drive circuit to which the voltage of 5 V is applied in the EPROM circuit is formed on the n-type impurity layer 142, and also the p-channel transistor of the drive circuit to which the voltage of 12.5 V is applied is formed on the n-type impurity layer 142. At this time, the voltages applied to the n-type impurity layers 141 and 142 are of different potential, 5 V and 12.5 V, respectively. Since, however, the n-type impurity layers 141 and 142 are surrounded by the deeply extending p-type impurity layers 134, 135 and 136, the n-type impurity layers 141 and 142 are electrically separated from each other. Thus the EPROM circuit containing the EPROM becomes substantially equivalent to the case when formed on a p-type silicon substrate.

Next, in the microcomputer circuit containing the analog circuit, the p-channel transistors of the drive circuit to which the voltage of 5 V is applied are formed on the n-type impurity layers 143 and 144. At this time, the potential of the n-type epitaxial layer 130 is also raised to 5 V. The n-channel transistor in the EPROM circuit is formed on the deeply extending p-type impurity layer 135. This p-type impurity layer 135 is fixed to the ground potential. On the other hand, the n-channel transistors in the analog circuit are formed on the p-type impurity layers 143 and 144, where the source potential of the n-channel transistors and the potential of the deeply extending p-type impurity layers 134, 135 and 136 are made to be held in common, so that a normal analog operation can be attained.

In this way, the n-type impurity layer 140 and p-type impurity layers 143 and 144 are formed on the n-type epitaxial layer 131 and the CMOS microcomputer is formed thereon. Thus, they become substantially equivalent to the case when formed on an n-type silicon substrate. The respective p-type impurity layers are electrically separated from the p-type silicon substrate, so that the potential of each p-type impurity layers can be freely controlled.

POSSIBILITY OF INDUSTRIAL UTILIZATION

As described above, according to the present invention, the CMOS circuit or functional device formed on the impurity layer deeply extended to reach a silicon substrate and the epitaxial layer region surrounded by such an impurity layer becomes substantially equivalent to those formed on a silicon substrate having no epitaxial layer.

Besides, the CMOS circuit or functional device formed on the impurity layer that does not reach the silicon substrate and on the epitaxial layer region is made electrically independent of the silicon substrate, and hence becomes substantially equivalent to the case when the epitaxial layer is made to serve as a substrate.

Since, as described above, the epitaxial layer of a conductivity type reverse to that of the silicon substrate is used, a plurality of functional devices can be formed respectively thereon at the same time.

The potential of the transistors formed on the p-type impurity layers deeply extended to reach the silicon substrate 101 communicates with the silicon substrate through the impurity layers. Hence, the voltage of the CMOS microcomputer circuit formed on the impurity layers that do not reach the silicon substrate can be electrically controlled independently of the silicon substrate, so that the degree of freedom for the arrangement of devices becomes higher to make it possible to increase the degree of integration.

It is also possible to prevent occurrence of defective writing in the EPROM thus formed and also prevent the deterioration of an analog circuit that may be caused by the back bias.

I claim:

1. A process for manufacturing a semiconductor device, comprising the steps of:
   a) forming on a semiconductor substrate of one conductivity an epitaxial layer of a conductivity type reverse to that of said semiconductor substrate;
   b) forming an insulating film on said epitaxial layer of a first thickness;
   c) etching said insulating film over a first portion of the epitaxial layer into a film having a second thickness;
   d) forming in said first portion a first impurity layer of the same conductivity as said semiconductor substrate at a depth such that the first impurity layer reaches said substrate;
   e) forming a second impurity layer in a second portion of the epitaxial layer other than said first portion by implanting a first ion therein;
   f) forming an insulating film at least over the second impurity layer in said second portion of the epitaxial layer;
   g) forming a third impurity layer in a third portion of the epitaxial layer other than the first portion, the second portion and a remaining portion of the epitaxial layer by implanting a second portion ion therein; and
   i) subsequently forming an electrical functional device on at least said first impurity layer.

2. The process for manufacturing a semiconductor device according to claim 1, wherein said second impurity layer and said third impurity layer each have a depth smaller than a film thickness of said epitaxial layer so that each of said second and third impurity layers do not reach said semiconductor substrate.

3. The process for manufacturing a semiconductor device according to claim 1, wherein said third impurity layer is formed in self alignment.

* * * * *

UNITED STATES PATENT AND TRADEMARK OFFICE
CERTIFICATE OF CORRECTION

PATENT NO. : 5,744,373
DATED : April 28, 1998
INVENTOR(S) : Katsujiro Arai

It is certified that error appears in the above-indentified patent and that said Letters Patent is hereby corrected as shown below: On the title page:

Item: [30]
change "Apr. 25, 1898" to --Apr. 25, 1989--

Signed and Sealed this

Seventh Day of September, 1999

Attest:

Q. TODD DICKINSON

*Attesting Officer*   *Acting Commissioner of Patents and Trademarks*